US012561072B1

(12) United States Patent
Wan et al.

(10) Patent No.: US 12,561,072 B1
(45) Date of Patent: Feb. 24, 2026

(54) CORRECTIVE READ WITH PARALLEL AUTO-READ CALIBRATION IN A MEMORY SUB-SYSTEM

(71) Applicant: Micron Technology, Inc., Boise, ID (US)

(72) Inventors: Jun Wan, San Jose, CA (US); Ying Yu Tai, Mountain View, CA (US); Zhenming Zhou, San Jose, CA (US); Yu-Chung Lien, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/967,292

(22) Filed: Dec. 3, 2024

(51) Int. Cl.
*G06F 3/06* (2006.01)
*G11C 16/04* (2006.01)
*G11C 16/26* (2006.01)

(52) U.S. Cl.
CPC .......... *G06F 3/0619* (2013.01); *G06F 3/0653* (2013.01); *G06F 3/0659* (2013.01); *G06F 3/0679* (2013.01); *G11C 16/0483* (2013.01); *G11C 16/26* (2013.01)

(58) Field of Classification Search
CPC . G11C 16/26; G11C 16/0483; G11C 11/5642;

G11C 16/3431; G11C 2207/2254; G06F 3/0619; G06F 3/0679; G06F 3/0653; G06F 3/0659; G06F 11/07; G06F 11/1016
USPC .......................................................... 711/103
See application file for complete search history.

(56) References Cited

U.S. PATENT DOCUMENTS

| | | | | |
|---|---|---|---|---|
| 2012/0274666 A1* | 11/2012 | Aflatooni | ............. | G09G 3/2003 |
| | | | | 345/690 |
| 2023/0395170 A1* | 12/2023 | Rayaprolu | ......... | G11C 16/3427 |
| 2025/0029663 A1* | 1/2025 | Lien | .................... | G11C 11/5642 |

* cited by examiner

*Primary Examiner* — Hashem Farrokh
(74) *Attorney, Agent, or Firm* — Lowenstein Sandler LLP

(57) ABSTRACT

Processing logic in a memory device detects a trigger for a corrective read operation on one or more memory cells associated with a selected wordline of a memory array of a memory device and performs an auto-read calibration operation to identify a center voltage. The processing logic further determines a fixed voltage offset with respect to the center voltage, the fixed voltage offset being associated with the corrective read operation, performs a parallel auto-read calibration operation on the fixed voltage offset to identify a calibrated read voltage level, and performs the corrective read operation using the calibrated read voltage level.

20 Claims, 6 Drawing Sheets

300

DETECT TRIGGER FOR CORRECTIVE READ OPERATION 305

↓

PERFORM AUTO-READ CALIBRATION OPERATION TO IDENTIFY CENTER VOLTAGE 310

↓

DETERMINE FIXED VOLTAGE OFFSET ASSOCIATED WITH CORRECTIVE READ OPERATION 315

↓

PERFORM PARALLEL AUTO-READ CALIBRATION OPERATION ON FIXED VOLTAGE OFFSET TO IDENTIFY CALIBRATED READ VOLTAGE 320

↓

PERFORM CORRECTIVE READ OPERATION USING CALIBRATED READ VOLTAGE 325

CORRECTIVE READ WITH PARALLEL AUTO-READ CALIBRATION IN A MEMORY SUB-SYSTEM

TECHNICAL FIELD

Embodiments of the disclosure relate generally to memory sub-systems, and more specifically, relate to corrective read with parallel auto-read calibration in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
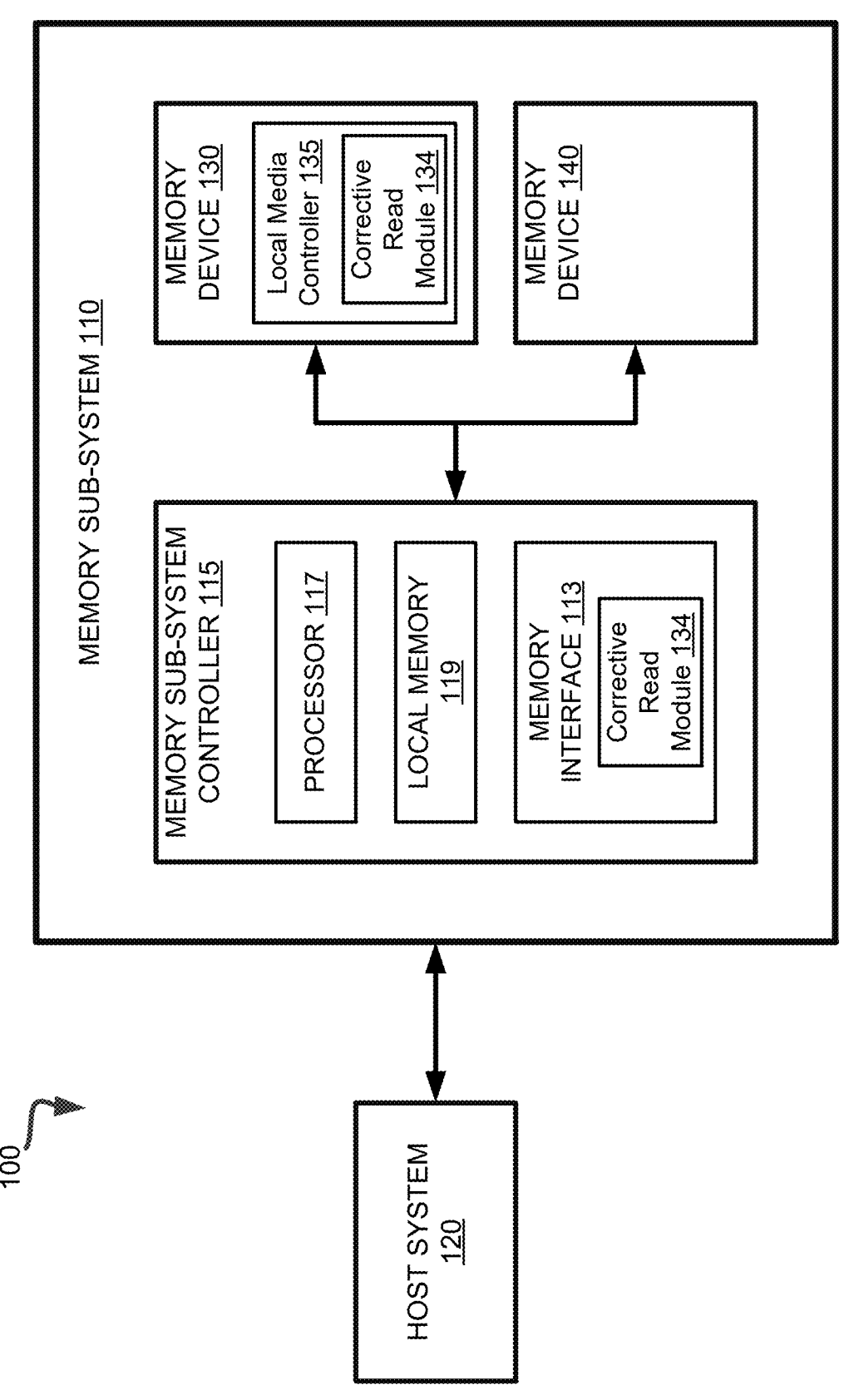
FIG. 1A illustrates an example computing system that includes a memory sub-system in accordance with some embodiments of the present disclosure.

Aspects of the present disclosure are directed to corrective read with parallel auto-read calibration in a memory device of a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

Memory access operations (e.g., program operations, read operations, erase operations) can be executed with respect to the memory cells by applying a wordline bias voltage to wordlines with which memory cells of a selected page are associated. For example, during a programming operation, one or more selected memory cells can be programmed by the application of a programming voltage to a selected wordline. Similarly, during a read operation, the one or more selected memory cells can be read by the application of a read voltage to the selected wordline. If a threshold voltage (Vt) of the target memory cell is identified as being below the applied read voltage, then the data stored at the target cell can be read as a particular value (e.g., a logical '1') or determined to be in a particular state (e.g., a "set" state). If the threshold voltage of the specified memory cell is identified as being above the read reference voltage, then the data stored at the specified memory cell can be read as another value (e.g., a logical '0') or determined to be in another state (e.g., a "reset" state). A given level for a set of cells may have a range of threshold voltages (e.g., such as a normal distribution of threshold voltages). Thus, the read voltage can be applied to memory cells to determine values stored at the memory cells.

Some memory devices can be subject to physical phenomena that affect the charge stored in their cells (e.g., charge loss) and consequently, also affect the respective threshold voltages of the cells. These phenomena can arise in a memory array between one or more specified cells and their respective groups of adjacent cells. Examples of such phenomena include slow charge loss "SCL," intrinsic charge loss "ICL," and lateral charge migration "LCM" (e.g., charge migration between adjacent cells). These physical phenomena can lead to significant threshold voltage shifts in the target cell or set of cells. For example, the shift can be sufficient to cause a memory access operation performed on the target cell to result in a sensed state other than the one associated with the programming level of the target cell (e.g., a programmed logical '1' state can instead be read as a logical '0' state, etc.). Consequently, these physical phenomena can cause a lowering and widening of the threshold voltage distribution associated with a given programming level, (e.g., L1, L2, etc.), and impair the ability to accurately read values from the given programming level.

In some situations, charge loss in a cell can be mitigated by a voltage compensation during read operations or programming (e.g., write) operations that are performed on the cells of the memory device. More specifically, adjustments can be made to voltages applied to a cell in the course of read operations and write operations to compensate for the multiple shifted threshold voltage distributions created due to the effects of corresponding programming levels of one or more adjacent cells (e.g., "aggressor" cells). These adjusted voltages (e.g., a read reference voltage or a program-verify voltage) applied in the course of such memory access operations can be offset (e.g., in an opposite direction) relative to the threshold voltage of a specified cell to counteract the effects of charge loss. Shifting or aligning the means (e.g., averages) of the threshold voltage distributions through voltage adjustments of a given programming level's threshold voltage distribution can compensate for the widening of the overarching threshold distribution of the given programming level.

In some implementations, when an error is encountered during a read operation (e.g., a hard read failure) with respect to a memory cell (e.g., a target cell), or when a bit error rate (BER) with respect to multiple cells is exceeded, a sequence of error handling operations (or sequence of recovery steps) can be undertaken. This sequence can include performing a corrective read operation. A corrective read operation can include applying one or more adjusted (e.g., compensated) read reference voltages (e.g., voltages offset from a default read reference voltage) to determine the programming state of the target cell (depending on the programming level of an adjacent aggressor cell). For example, depending on the measured threshold voltage of a memory cell associated with one or more adjacent wordlines (i.e., WLn+1 and/or WLn−1), the memory device can identify a corresponding offset to be applied to the read voltage when reading a target memory cell associated with the selected wordline (i.e., WLn). Depending on the implementation, there can be multiple read offset values available, each corresponding to a respective range (e.g., bin) of threshold voltages for the adjacent memory cell(s).

While such a corrective read operation can be effective in recovering data retention errors, the applicable read offsets are generally optimized for a memory block under a certain set of conditions. For example, the read offsets may be configured for a block that is fully programmed (i.e., where there are no wordlines having associated memory cells that remain in an erased state), that has a high data retention time (i.e., where a significant amount of time has passed since the memory cells were programmed), and that is in a near end-of-life state (i.e., where a significant number of program/erase cycles have been performed on the block). As not all blocks in the memory device will meet this certain set of conditions, the default read offset values used to perform a corrective read operation may be sub-optimal, and potentially result in increased error rate and/or latency associated with performing the read operation.

Aspects of the present disclosure address the above and other deficiencies by providing for corrective read with parallel auto-read calibration (pARC) in a memory device of a memory sub-system. In one embodiment, when a corrective read operation is triggered (e.g., as part of the error handling flow associated with a read operation) for one or more memory cells associated with a selected wordline (i.e., WLn), either on-die control logic of the memory device or a system-level memory sub-system controller can initiate an auto-read calibration operation to identify a center voltage between two adjacent programming distributions of memory cells associated with the selected wordline. In the auto-read calibration operation, the processing logic sweeps the threshold voltage level across a range around a baseline threshold voltage in an attempt to locate the valley bottom (i.e., the center voltage between the two adjacent programming distributions) where the read level can be placed. Once the center voltage is identified, the processing logic can initiate a corrective read operation. Rather than applying the fixed offsets normally associated with the corrective read operation, however, the processing logic can initiate a parallel auto-read calibration operation to identify the valley bottoms between two or more sub-distributions of memory cells (e.g., high and low voltage cells within a given programming distribution corresponding to a given programming level). These valley bottoms can represent calibrated read voltage levels which can be used to perform a final read operation of the memory cells associated with the selected wordline.

Advantages of this approach include, but are not limited to, improved performance in the memory sub-system. The approach described herein can reduce the error rate resulting from the corrective read operation regardless of the current condition of the memory cells (i.e., partially programmed blocks, data retention time, near end-of-life state). The improved effectiveness of the corrective read operation can also decrease read latency and reduce the need for further error handling, thereby freeing memory sub-system resources for other tasks.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the physical host interface (e.g., PCIe or CXL bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (processing device) configured to execute instructions stored in local memory 119 for performing the operations described herein. In some embodiments, the memory interface component 113 is part of the host system 110, an application, or an operating system.

In one embodiment, memory device 130 includes a corrective read module 134 configured to carry out corresponding memory access operations, in response to receiving the memory access commands from memory interface 113. In some embodiments, local media controller 135 includes at least a portion of corrective read module 134 and is configured to perform the functionality described herein. In some embodiments, corrective read module 134 is implemented on memory device 130 using firmware, hardware components, or a combination of the above. In other embodiments, memory interface 113, or some other portion of memory sub-system controller 115, includes at least a portion of corrective read module 134, which may be executed, for example, by processor 117.

In one embodiment, corrective read module 134 receives, from a requestor, such as memory interface 113, a request to perform a corrective read operation on one or more memory cells of a memory array of memory device 130. The memory array can include an array of memory cells formed at the intersections of wordlines and bitlines. In one embodiment, the memory cells are grouped into blocks, which can be further divided into sub-blocks, where a given wordline is shared across a number of sub-blocks, for example. In one embodiment, each sub-block corresponds to a separate plane in the memory array. The group of memory cells associated with a wordline within a sub-block can be referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, corrective read module 134 can perform a corrective read on memory device 130 using parallel auto-read calibration (pARC). For example, when a corrective read operation is triggered (e.g., as part of the error handling flow associated with a read operation) for one or more memory cells associated with a selected wordline (i.e., WLn), corrective read module 134 can initiate an auto-read calibration operation to identify a center voltage between two adjacent programming distributions of memory cells associated with the selected wordline. In the auto-read calibration operation, corrective read module 134 sweeps the threshold voltage level across a range around a baseline threshold voltage in an attempt to locate the valley bottom (i.e., the center voltage between the two adjacent programming distributions) where the read level can be placed. Once the center voltage is identified, corrective read module 134 can initiate the corrective read operation. Rather than applying the fixed offsets normally associated with the corrective read operation, however, corrective read module 134 can initiate a parallel auto-read calibration operation to identify the valley bottoms between two or more sub-distributions of memory cells (e.g., high and low voltage cells within a given programming distribution corresponding to a given programming level). These valley bottoms can represent calibrated read voltage levels which can be used to perform a final read operation of the memory cells associated with the selected wordline. Further details with regards to the operations of corrective read module 134 are described below.

Figure 1B:
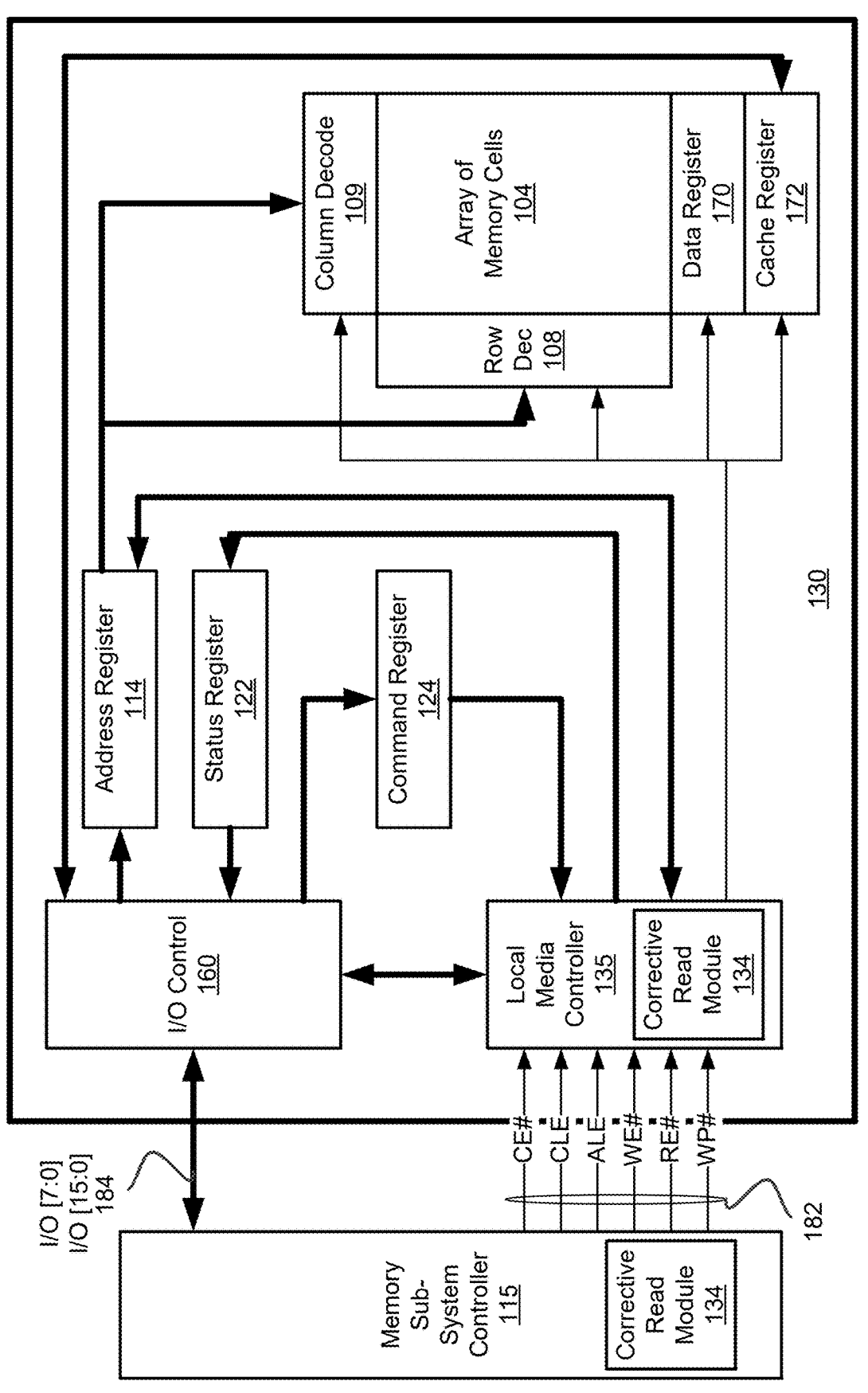
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device, and may include corrective read module 134, which can implement the corrective read with using parallel auto-read calibration on memory device 130, as described herein.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In one embodiment, local media controller 135 includes corrective read module 134, which can implement the corrective read with using parallel auto-read calibration on memory device 130, as described herein.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 182. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 182 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 184 and outputs data to the memory sub-system controller 115 over I/O bus 184.

For example, the commands may be received over input/output (I/O) pins [7:0] of I/O bus 184 at I/O control circuitry 160 and may then be written into command register 124. The addresses may be received over input/output (I/O) pins [7:0] of I/O bus 184 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
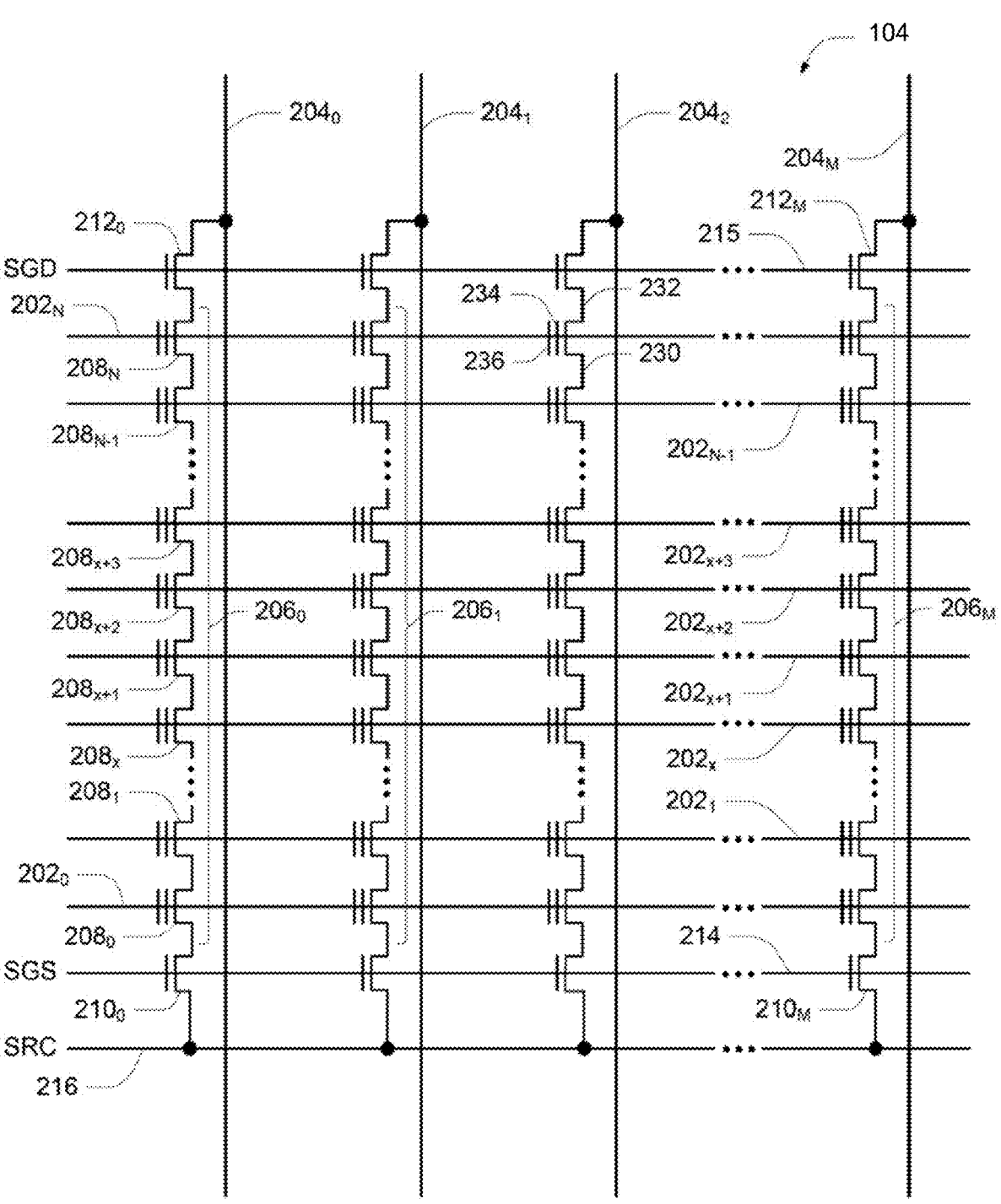
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
FIG. 3 is a flow diagram of an example method of performing a corrective read with parallel auto-read calibration in a memory device of a memory sub-system in accordance with some embodiments of the present disclosure.
Figure 3:
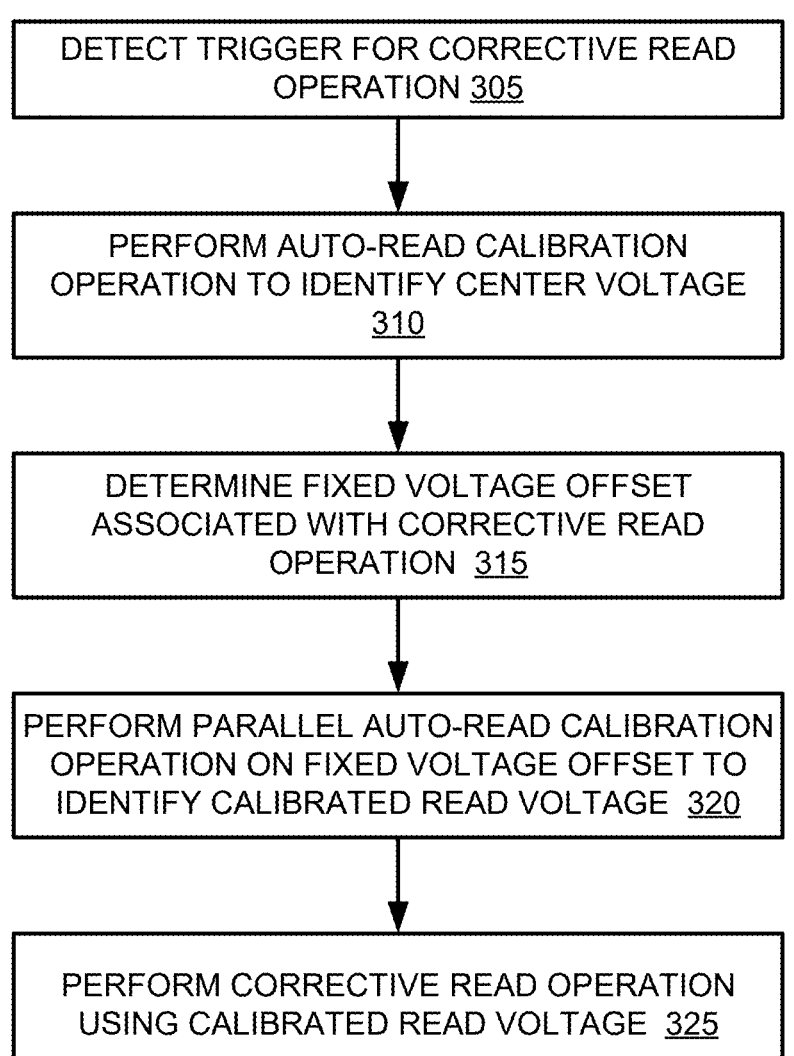

FIG. 3 is a flow diagram of an example method of performing a corrective read with parallel auto-read calibration in a memory device of a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by corrective read module 134 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic (e.g., corrective read module 134) detects a trigger for a corrective read operation on one or more memory cells associated with a selected wordline of a memory array of a memory device, such as a wordline 202 of memory array 104 of memory device 130. For example, the trigger can include at least one of a request to perform the corrective read operation or a failure of a read operation on the one or more memory cells associated with the selected wordline. In one embodiment, the trigger is detected in response to a failure of a read operation on the one or more memory cells associated with a selected wordline using a default read voltage (i.e., without any read voltage offset). For example, a read operation may have been previously attempted to read the one or more memory cells associated with the selected wordline, and a resulting number of errors or an error rate may have exceeded an associated threshold, such that the read operation failed. As part of the error handling flow in the memory sub-system, the memory sub-system controller 115 can request (e.g., send a command) that a corrective read operation be performed, where such request/command is received by corrective read module 134.

Figures 4A, 4B:
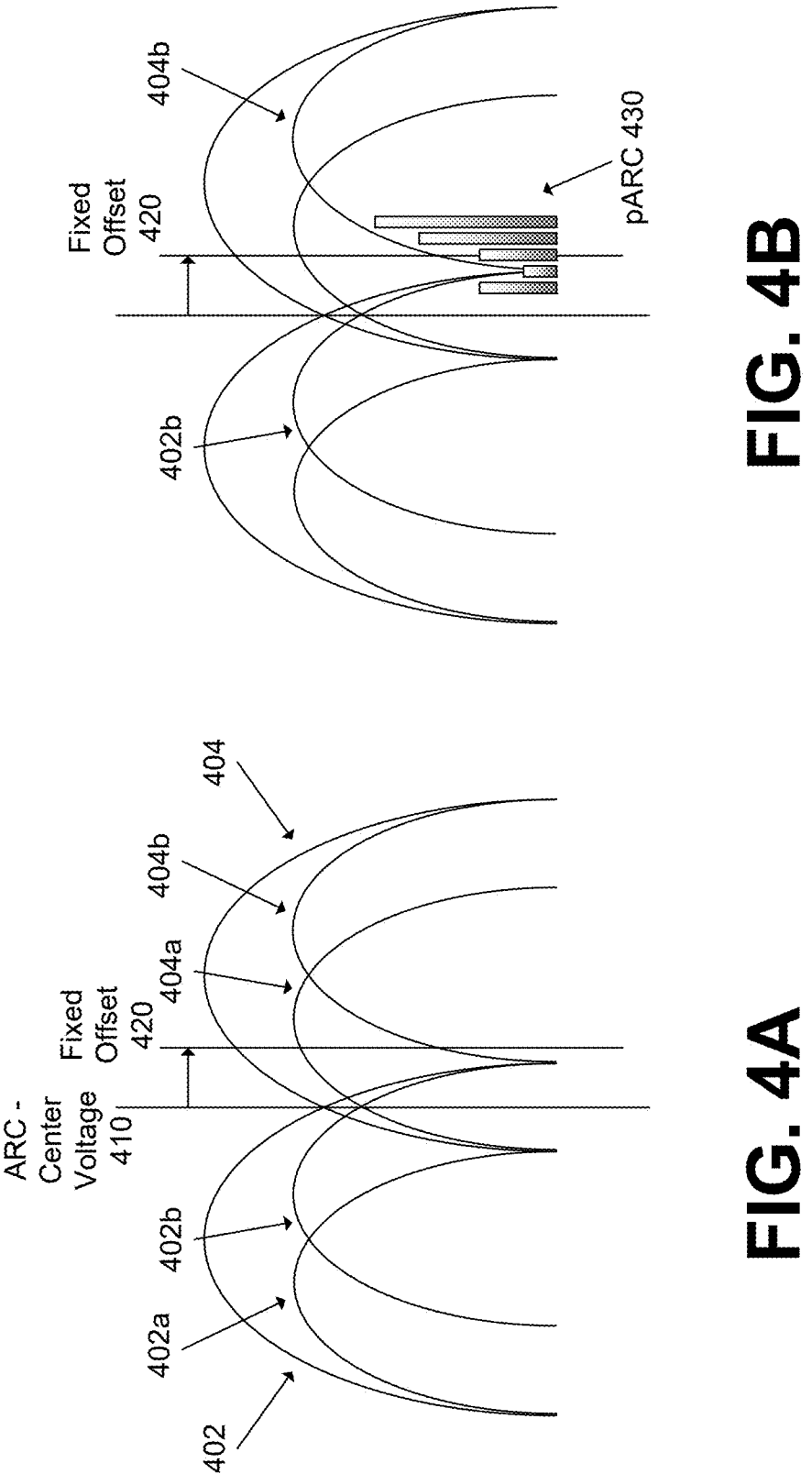
FIG. 4A and FIG. 4B are diagrams illustrating programming distributions and sub-distributions on which a corrective read with parallel auto-read calibration can be performed in accordance with one or more embodiments of the present disclosure.

At operation 310, the processing logic performs an auto-read calibration operation to identify a center voltage. In one embodiment, during the auto-read calibration operation, corrective read module 134 sweeps the threshold voltage level across a range around a baseline threshold voltage or threshold voltage set. Sweeping the threshold voltage level across the range includes selecting a subset of threshold voltages in the range and reading the physical address of memory device 130 using the subset of threshold voltages. A set of threshold voltage levels will be identified after the sweeping and then used to read the physical addresses to get the data. The auto-read calibration operation serves to identify a read voltage level that corresponds to the bottom of the valley between programming distributions, thereby decreasing the number of errors observed during a read operation. As illustrated in FIG. 4A, there can be a number of programming distributions 402 and 404, each representing memory cells programmed to a given programming level and having respective corresponding multi-bit values. For example, in TLC memory, there may be eight programming distributions each representing memory cells storing respective three bit values, and in QLC memory, there may be 16 programming distributions each representing memory cells storing respective four bit values. In one embodiment, the center voltage, such as center voltage 410 includes a voltage disposed between the two programming distributions of memory cells 402 and 404 associated with the selected wordline. In one embodiment, performing the auto-read calibration operation to identify the center voltage comprises sequentially applying a plurality of read voltages across a first range to the selected wordline. Corrective read module 134 can identify the center voltage 410 as the one of the plurality of read voltages having a lowest error rate.

Referring again to FIG. 3, at operation 315, the processing logic determines a fixed voltage offset with respect to the center voltage 410, the fixed voltage offset being associated with the corrective read operation. The corrective read operation can include applying one or more adjusted (e.g., compensated) read reference voltages which are offset from the center voltage 410 by the fixed offset amount. One example of this fixed offset 420 is illustrated in FIG. 4A, although there may be multiple fixed offsets at voltages both above and below the center voltage 410. The fixed offsets may be preconfigured amounts that, as described above, are optimized for blocks under certain conditions (e.g., fully programmed, high data retention, end-of-life-state). Not all blocks will meet these conditions, however, and thus the fixed offsets may be sub-optimal. For example, as illustrated in FIG. 4A, each programming distributions 402 and 404 includes two or more sub-distributions of memory cells. In one embodiment, distribution 402 includes low-voltage sub-distribution 402a and high-voltage sub-distribution 402b, while distribution 404 includes low-voltage sub-distribution 404a and high-voltage sub-distribution 404b. To further improve the accuracy of the corrective read operation, the processing logic can identify read voltage levels that are between two of these sub-distributions. For example, the processing logic may target a read level between high-voltage sub-distribution 402b and high-voltage sub-distribution 404b. As shown in FIG. 4A, the fixed voltage offset 420 is not exactly aligned with the valley between high-voltage sub-distribution 402b and high-voltage sub-distribution 404b.

Referring again to FIG. 3, at operation 320, the processing logic performs a parallel auto-read calibration operation (pARC) on the fixed voltage offset 420 to identify a calibrated read voltage level. In a parallel auto-read calibration operation, corrective read module 134 can perform a sequence of read operations at different read voltage levels, but starting at and centered on the fixed voltage offset 420. As illustrated in FIG. 4B, corrective read module 134 can generate a histogram 430 representing the error counts from that sequence of read operations and use the histogram 430 to identify the mid-point of the valley between two adjacent sub-distributions, such as high-voltage sub-distribution 402b and high-voltage sub-distribution 404b. The calibrated read voltage level can be a voltage disposed at that mid-point between the two sub-distributions of memory cells associated with the selected wordline. In one embodiment, performing the parallel auto-read calibration operation on the fixed voltage offset 420 to identify the calibrated read voltage level comprises concurrently applying a plurality of read voltages across a voltage range centered on the fixed voltage offset 420, and the calibrated read voltage level comprises one of the plurality of read voltages having a lowest error rate.

In one embodiment, the parallel auto-read calibration operation is performed using boost modulation sensing enabled by a number of boost regulators. The boost regulators can provide different boost voltages to capacitively change the voltage at a sense node of a sense circuit in the memory device that is coupled to the selected wordline. A first boost voltage can bring the sense node to an initial voltage, and each subsequent boost voltage can slightly vary the voltage at the sense node. In certain memory systems, two separate sensing operations use a total of five different boost voltage levels to sense (e.g., attempt to read or verify) the memory cell via the data line. The sensed voltage levels along the adjacent threshold voltage distributions of the cell can result in histogram data, such as histogram 430, that probe threshold voltage levels between the adjacent sub-distributions. By analyzing these histograms, corrective read module 134 can determine the local minima which represents the calibrated read voltage level. Although not illustrated in FIG. 4B, it should be understood that additional parallel auto-read calibration operations can be performed (e.g., using any additional fixed voltage offsets associated with the corrective read operation) to identify calibrated read voltage levels corresponding between other distributions, such as between low-voltage sub-distribution 402a and low-voltage sub-distribution 404a, for example.

At operation 325, the processing logic performs the corrective read operation using the calibrated read voltage level. In one embodiment, performing the corrective read operation using the calibrated read voltage level comprises causing the calibrated read voltage level to be applied to the selected wordline of the memory array. The calibrated read voltage level is used to distinguish between the two logical states represented by the adjacent sub-distributions and results in a lower error rate during the read operation.

Figure 5:
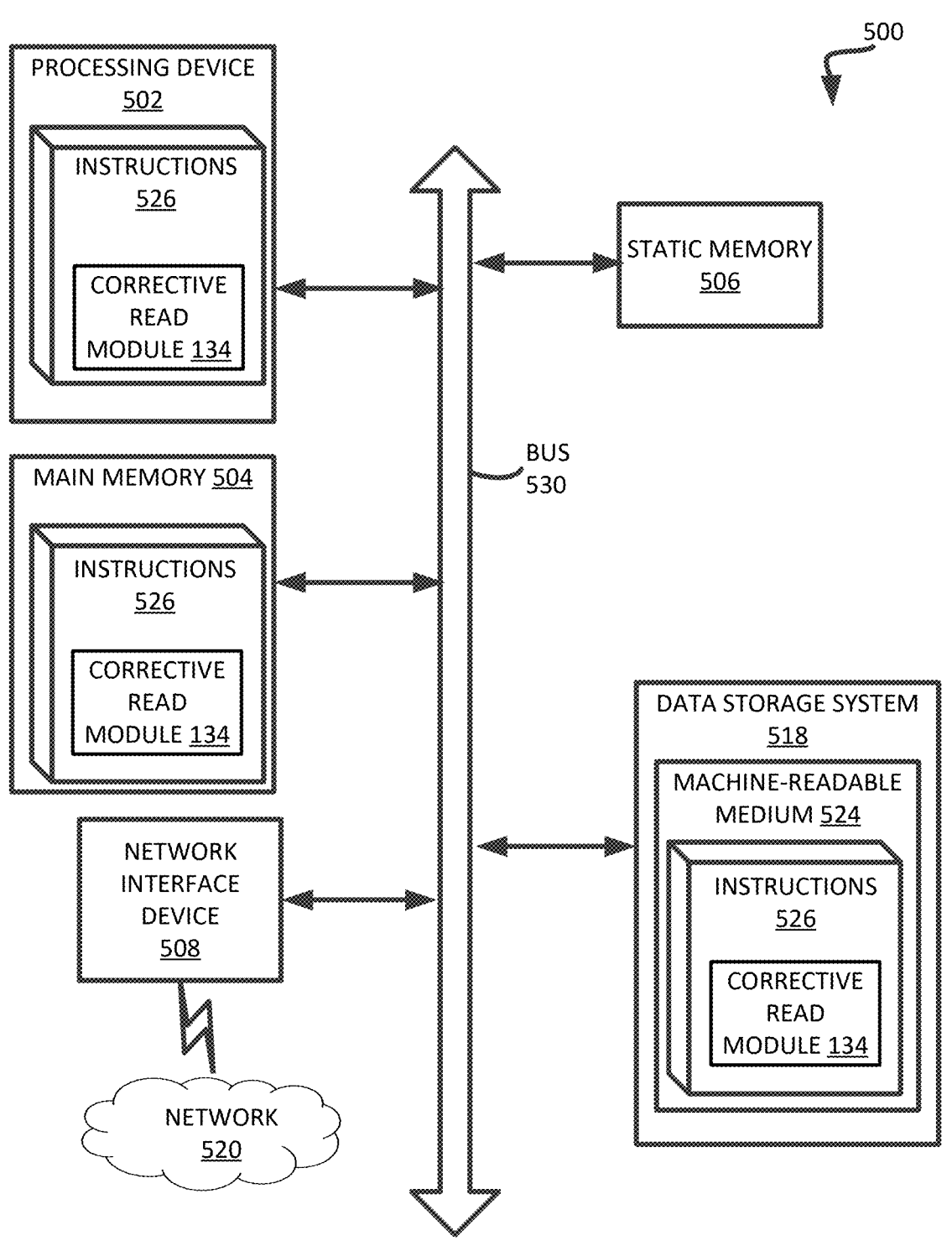
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the corrective read module 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the corrective read module 134 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory device comprising a memory array, the memory array comprising a plurality of memory cells; and
   a processing device, operatively coupled with the memory device, to perform operations comprising:
      detecting a trigger for a corrective read operation on one or more memory cells associated with a selected wordline of the memory array;
      performing an auto-read calibration operation to identify a center voltage;

determining a fixed voltage offset with respect to the center voltage, the fixed voltage offset being associated with the corrective read operation;
      performing a parallel auto-read calibration operation on the fixed voltage offset to identify a calibrated read voltage level; and
      performing the corrective read operation using the calibrated read voltage level.

2. The memory device of claim 1, wherein the trigger comprises at least one of a request to perform the corrective read operation or a failure of a read operation on the one or more memory cells associated with the selected wordline.

3. The memory device of claim 1, wherein the center voltage comprises a voltage disposed between two programming distributions of memory cells associated with the selected wordline.

4. The memory device of claim 3, wherein performing the auto-read calibration operation to identify the center voltage comprises sequentially applying a plurality of read voltages across a first range to the selected wordline, and wherein the center voltage comprises one of the plurality of read voltages having a lowest error rate.

5. The memory device of claim 1, wherein the calibrated read voltage level comprises a voltage disposed between two sub-distributions of memory cells associated with the selected wordline.

6. The memory device of claim 5, wherein performing the parallel auto-read calibration operation on the fixed voltage offset to identify the calibrated read voltage level comprises concurrently applying a plurality of read voltages across a voltage range centered on the fixed voltage offset, wherein the calibrated read voltage level comprises one of the plurality of read voltages having a lowest error rate.

7. The memory device of claim 1, wherein performing the corrective read operation using the calibrated read voltage level comprises causing the calibrated read voltage level to be applied to the selected wordline.

8. A method comprising:
   detecting a trigger for a corrective read operation on one or more memory cells associated with a selected wordline of a memory array of a memory device;
   performing an auto-read calibration operation to identify a center voltage;
   determining a fixed voltage offset with respect to the center voltage, the fixed voltage offset being associated with the corrective read operation;
   performing a parallel auto-read calibration operation on the fixed voltage offset to identify a calibrated read voltage level; and
   performing the corrective read operation using the calibrated read voltage level.

9. The method of claim 8, wherein the trigger comprises at least one of a request to perform the corrective read operation or a failure of a read operation on the one or more memory cells associated with the selected wordline.

10. The method of claim 8, wherein the center voltage comprises a voltage disposed between two programming distributions of memory cells associated with the selected wordline.

11. The method of claim 10, wherein performing the auto-read calibration operation to identify the center voltage comprises sequentially applying a plurality of read voltages across a first range to the selected wordline, and wherein the center voltage comprises one of the plurality of read voltages having a lowest error rate.

12. The method of claim 8, wherein the calibrated read voltage level comprises a voltage disposed between two sub-distributions of memory cells associated with the selected wordline.

13. The method of claim 12, wherein performing the parallel auto-read calibration operation on the fixed voltage offset to identify the calibrated read voltage level comprises concurrently applying a plurality of read voltages across a voltage range centered on the fixed voltage offset, wherein the calibrated read voltage level comprises one of the plurality of read voltages having a lowest error rate.

14. The method of claim 8, wherein performing the corrective read operation using the calibrated read voltage level comprises causing the calibrated read voltage level to be applied to the selected wordline.

15. A non-transitory computer-readable storage medium comprising instructions that, when executed by a processing device, cause the processing device to perform operations comprising:

detecting a trigger for a corrective read operation on one or more memory cells associated with a selected wordline of a memory array of a memory device;

performing an auto-read calibration operation to identify a center voltage;

determining a fixed voltage offset with respect to the center voltage, the fixed voltage offset being associated with the corrective read operation;

performing a parallel auto-read calibration operation on the fixed voltage offset to identify a calibrated read voltage level; and performing the corrective read operation using the calibrated read voltage level.

16. The non-transitory computer-readable storage medium of claim 15, wherein the trigger comprises at least one of a request to perform the corrective read operation or a failure of a read operation on the one or more memory cells associated with the selected wordline.

17. The non-transitory computer-readable storage medium of claim 15, wherein the center voltage comprises a voltage disposed between two programming distributions of memory cells associated with the selected wordline.

18. The non-transitory computer-readable storage medium of claim 17, wherein performing the auto-read calibration operation to identify the center voltage comprises sequentially applying a plurality of read voltages across a first range to the selected wordline, and wherein the center voltage comprises one of the plurality of read voltages having a lowest error rate.

19. The non-transitory computer-readable storage medium of claim 15, wherein the calibrated read voltage level comprises a voltage disposed between two sub-distributions of memory cells associated with the selected wordline.

20. The non-transitory computer-readable storage medium of claim 19, wherein performing the parallel auto-read calibration operation on the fixed voltage offset to identify the calibrated read voltage level comprises concurrently applying a plurality of read voltages across a voltage range centered on the fixed voltage offset, wherein the calibrated read voltage level comprises one of the plurality of read voltages having a lowest error rate.

\* \* \* \* \*